(12) United States Patent
Sjöland et al.

(10) Patent No.: US 11,888,491 B2
(45) Date of Patent: Jan. 30, 2024

(54) FREQUENCY DETECTOR FOR MEASURING AND TUNING FREQUENCY OF CONTROLLED OSCILLATOR

(71) Applicant: Telefonaktiebolaget LM Ericsson (publ), Stockholm (SE)

(72) Inventors: Henrik Sjöland, Lund (SE); Reda Kasri, Malmö (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 267 days.

(21) Appl. No.: 17/601,993

(22) PCT Filed: Apr. 11, 2019

(86) PCT No.: PCT/EP2019/059260
§ 371 (c)(1),
(2) Date: Oct. 7, 2021

(87) PCT Pub. No.: WO2020/207587
PCT Pub. Date: Oct. 15, 2020

(65) Prior Publication Data
US 2022/0158643 A1 May 19, 2022

(51) Int. Cl.
*H03L 7/091* (2006.01)
*H03L 7/099* (2006.01)

(52) U.S. Cl.
CPC ............ *H03L 7/091* (2013.01); *H03L 7/0995* (2013.01)

(58) Field of Classification Search
CPC ..... H03L 7/091; H03L 7/0995; H03K 3/0315; H03K 3/011
See application file for complete search history.

(56) References Cited

U.S. PATENT DOCUMENTS

| 7,356,312 B2* | 4/2008 | Klemmer | H03L 7/0996 |
| | | | 455/256 |
| 7,558,548 B2* | 7/2009 | Konchistky | H04B 1/26 |
| | | | 455/190.1 |

(Continued)

FOREIGN PATENT DOCUMENTS

| EP | 3255453 A1 | 12/2017 |
| WO | 2014109964 A1 | 7/2014 |

OTHER PUBLICATIONS

Bryant, Carl, et al., "A 2.45GHz, 50uW Wake-up Receiver Front-end with −88dBm Sensitivity and 250kbps Data Rate", Proceedings of European Solid State Circuits Conference (ESSCIRC), 2014, 235-238.

(Continued)

*Primary Examiner* — Sung S Ahn
(74) *Attorney, Agent, or Firm* — Murphy, Bilak & Homiller, PLLC

(57) ABSTRACT

A frequency detector (200) and method therein for measuring and tuning a frequency of a controlled oscillator are disclosed. The frequency detector (200) comprises a pulse generator (210) for generating sampling pulses; a sample circuitry (220) for sampling output states of the controlled oscillator (180); and a digital processing unit (230). The sample circuitry (220) is configured to sub-sample the output states of the controlled oscillator (180) at two or more sampling frequencies, and all sampling frequencies are lower than the frequency of the controlled oscillator. The digital processing unit (230) is configured to calculate a frequency offset of the oscillator based on the sampled states and generate a control signal based on the frequency offset to tune the frequency of the oscillator.

22 Claims, 9 Drawing Sheets

(56) References Cited

U.S. PATENT DOCUMENTS

| | | |
|---|---|---|
| 9,705,507 B1 | 7/2017 | Jain |
| 2005/0156641 A1 | 7/2005 | Dimmler et al. |
| 2009/0284286 A1* | 11/2009 | van den Berg ........... H03L 7/16 327/107 |
| 2017/0047932 A1 | 2/2017 | Gopalakrishnan et al. |

OTHER PUBLICATIONS

Grimaldi, Luigi, et al., "16.7 A 30GHz Digital Sub-Sampling Fractional-N PLL with 198fsrms Jitter in 65nm LP CMOS 11", 2019 IEEE International Solid-State Circuits Conference, Session 16, Frequency Synthesizers, 16.7, Feb. 19, 2019, 268-270.

Xu, Pengcheng, et al., "Optimizing TSPC Frequency Dividers for Always-On Low-Frequency Applications in 28nm FDSOI CMOS", IEEE SOI-3D-Subthreshold Microelectronics Technology Unified Conference (S3S), 2017, 1-2.

* cited by examiner

FREQUENCY DETECTOR FOR MEASURING AND TUNING FREQUENCY OF CONTROLLED OSCILLATOR

TECHNICAL FIELD

Embodiments herein relate to frequency detectors for measuring and tuning frequency of controlled oscillators. In particular, they relate to frequency detectors with subsampling frequency detection and frequency generation circuitry comprising the frequency detectors as well as electronic devices, such as receivers, transmitters and transceivers comprising the frequency generation circuitry.

BACKGROUND

There is a strong trend in the wireless communication systems towards supporting devices with ultra-low power consumption. These devices may be small sensor nodes where a battery should last many years, or where energy scavenging is used to achieve battery-less operation. When the wireless communication system is to communicate with such devices, a receiver must be operated in the device. To achieve a limited response time, the receiver must be operated regularly. The power consumption of the receiver must then be limited. A special ultra-low power so called wakeup receiver is thus often used. The performance of that wakeup receiver is limited and it is only able to detect the presence of a wakeup request. When such a request is present, a main receiver with higher performance and higher power is started to be able to receive the actual communication data.

To achieve ultra-low power consumption, e.g. below 100 uW, the wakeup receivers are based on amplitude detection of on-off keying signals. Generation of accurate local oscillator (LO) signals using power hungry phase-locked loops (PLLs) may thereby be avoided. However, only modest filtering may be realized prior to amplitude detection, and immunity to interference is essentially limited to what can be achieved by correlation of pseudorandom noise (PN) sequences.

Due to the limited amount of filtering prior to amplitude detection the wakeup receivers are very vulnerable to interference. All interference and noise entering the amplitude detector having amplitude modulation in the same frequency range as the wakeup request signal will mask the desired signal. It should here be understood that the same frequency does not imply that the interference is only present on the same frequency channel. Instead, because of the limited ability to filter out signals with frequency adjacent to the wakeup signal, it should be understood that also signals transmitted in adjacent channels and potentially even further away will effectively have as detrimental effect as a co-channel interferer signal. To be able to effectively filter out adjacent interference, the frequency generation in the wakeup receiver must have high accuracy and thus consume significant energy. Furthermore, the amplitude detector is also heavily non-linear and therefore produces very small output signals for weak input signals. Assuming that the amplitude detector has a quadratic characteristic for small input signals, this means that the signal to noise ratio falls off by 20 dB for each 10 dB reduction of the input signal level, which quickly becomes very unfavourable already with modest amounts of interference at the detector input. More filtering prior to the amplitude detection is therefore necessary to achieve wakeup receivers with high immunity to interference, which however will increase the power consumption.

SUMMARY

Therefor it is an object of embodiments herein to provide a frequency generation circuitry with improved performance on accuracy and power consumption.

According to one aspect of embodiments herein, the object is achieved by a frequency detector for measuring and tuning a frequency of a controlled oscillator. The frequency detector comprises a pulse generator for generating sampling pulses; a sample circuitry for sampling output states of the controlled oscillator and a digital processing unit. The sample circuitry is configured to sub-sample the output states of the controlled oscillator at two or more sampling frequencies, and all sampling frequencies are lower than the frequency of the controlled oscillator. The digital processing unit is configured to calculate a frequency offset of the oscillator based on the sampled states and generate a control signal based on the frequency offset to tune the frequency of the oscillator.

According to one aspect of embodiments herein, the object is achieved by a frequency detector for measuring and tuning a frequency of a controlled oscillator. The frequency detector comprises a pulse generator for generating sampling pulses; a multi-stage frequency divider connected to the output of the controlled oscillator; a sample circuitry for sampling output states from each stage of the divider and a digital processing unit. The sample circuitry is configured to sub-sample the output states of the divider at a sampling frequency lower than the frequency of the controlled oscillator. The digital processing unit is configured to calculate a frequency offset of the oscillator based on the sampled states and generate a control signal based on the frequency offset to tune the frequency of the oscillator.

According to one aspect of embodiments herein, the object is achieved by a method for measuring and tuning a frequency of a controlled oscillator. The method comprises sub-sampling states of the controlled oscillator at a sampling frequency lower than the frequency of the controlled oscillator; calculating a state difference between each pair of adjacent sampled states; estimating a frequency offset based on the state differences; generating a control signal based on the frequency offset; and tuning the frequency of a controlled oscillator based on the control signal.

The embodiments herein provide a technique for digital frequency measurement, calibration and locking of oscillator frequency for an ultra-low power device, e.g. a wakeup receiver, where a conventional PLL would be too power consuming. The frequency detection is based on sub-sampling the controlled oscillator state. The sampling pulses thus may be generated by relatively low frequency PLLs, e.g. operating at a frequency more than an order of magnitude below the radio frequency (RF) of the oscillator. These PLLs may thus have very low power compared to an RF PLL. The sub-sampling creates an aliasing problem, so that different oscillator frequencies will generate the same sub-sampled signal. To solve the aliasing problem, multiple sampling frequencies, all lower than the oscillator frequency, may be used without employing high RF sampling frequencies. An alternative to solve the alias problem may be by momentarily operating an RF frequency divider connected to the controlled oscillator and sampling its state. This will also eliminate aliases inside the oscillator tuning range. The simplest possible frequency divider may be used, e.g. a cascade of divide-by-two circuits with minimum power overhead. Further, the divider may be used only during a fraction of the time, e.g. during starting the oscillator or coarse tuning of the oscillator to save power.

The oscillator frequency may be estimated by filtering or averaging oscillator sampled state differences, which may be calculated as sampled phase state differences of the oscillator and/or divider. So the technique is digital, provides a digital frequency estimate, yields a large degree of flexibility in the algorithms for oscillator frequency calibration and tuning. The alias free frequency range of the sampling technique may be made to exceed the magnitude of the highest sampling frequency, by combining the sampling results at several sampling frequencies, or alternatively by momentarily operating a simple frequency divider and sampling its state. The technique may be used in an all-digital frequency locked loop (ADFLL), or for oscillator frequency calibration.

According to embodiments herein, a frequency generation circuitry is implemented using the frequency detectors described above to tuning and locking a controlled oscillator.

The frequency generation circuitry is therefore based on sub-sampling the controlled oscillator state, which eliminates the need for power hungry frequency dividers and PLLs continuously operating at full RF. The frequency generation circuitry according to embodiments herein may be realized with sufficient accuracy and with significantly lower power consumption than conventional frequency generation circuitry using PLLs. The frequency accuracy will be superior to a free-running oscillator, and the bandwidth of a receiver using the frequency generation circuitry may be effectively limited by filters after frequency down-conversion mixers. The amount of noise and interference reaching the amplitude detector of the receiver will then be limited. The digital implementation also provides high flexibility in algorithms and operation modes.

According to embodiments herein, an electronic device, e.g. a wake-up receiver, is implemented using the frequency generation circuitry described above. Due to the more accurate, but still ultra-low power, local frequency generation circuitry, the selectivity and sensitivity of a wake-up receiver may be improved, achieved by using a more narrow-band filtering after frequency down-conversion mixers. The major advantage is thus increased wake-up receiver performance and immunity to interference at a limited power overhead.

Therefore, the embodiments herein provide a frequency generation circuitry with improved performance on accuracy and power consumption.

BRIEF DESCRIPTION OF THE DRAWINGS

Examples of embodiments herein are described in more detail with reference to attached drawings in which.

DETAILED DESCRIPTION

Figure 1:
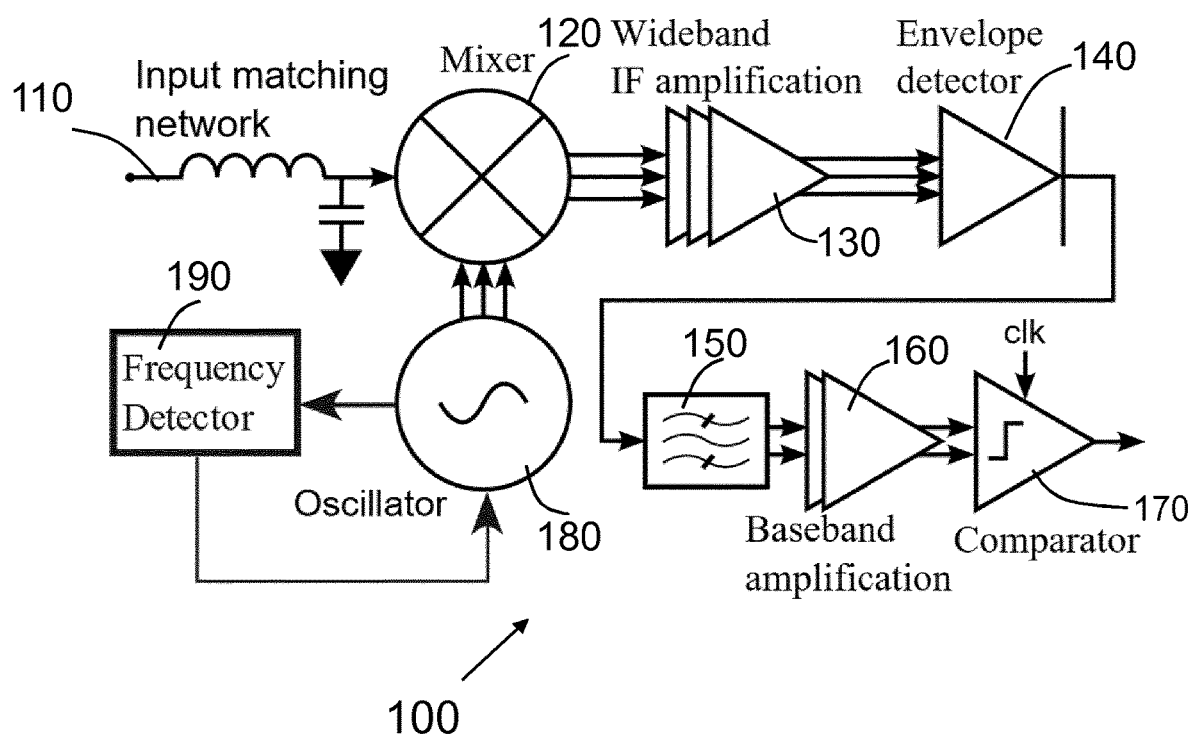
FIG. 1 is a schematic block view of a receiver in which a frequency detector according to embodiments herein may be implemented.

FIG. 1 shows a receiver 100 in which a frequency detector according to embodiments herein may be implemented.

The receiver 100 comprises an input matching network 110 for matching input impedance of an antenna to input impedance of a mixer 120. The mixer 120 converts received RF signals to intermediate frequency (IF) signals. The receiver 100 further comprises an IF amplifier 130 for amplifying the IF signals, an envelope detector 140, a bandpass filter 150, a baseband amplifier 160 and a comparator 170.

The receiver 100 further comprises an oscillator 180 to generate local oscillator signals for the mixer 120. A frequency detector 190 according to embodiments herein is implemented in the receiver 100 for measuring and tuning the frequency of the oscillator 180.

Figure 2:
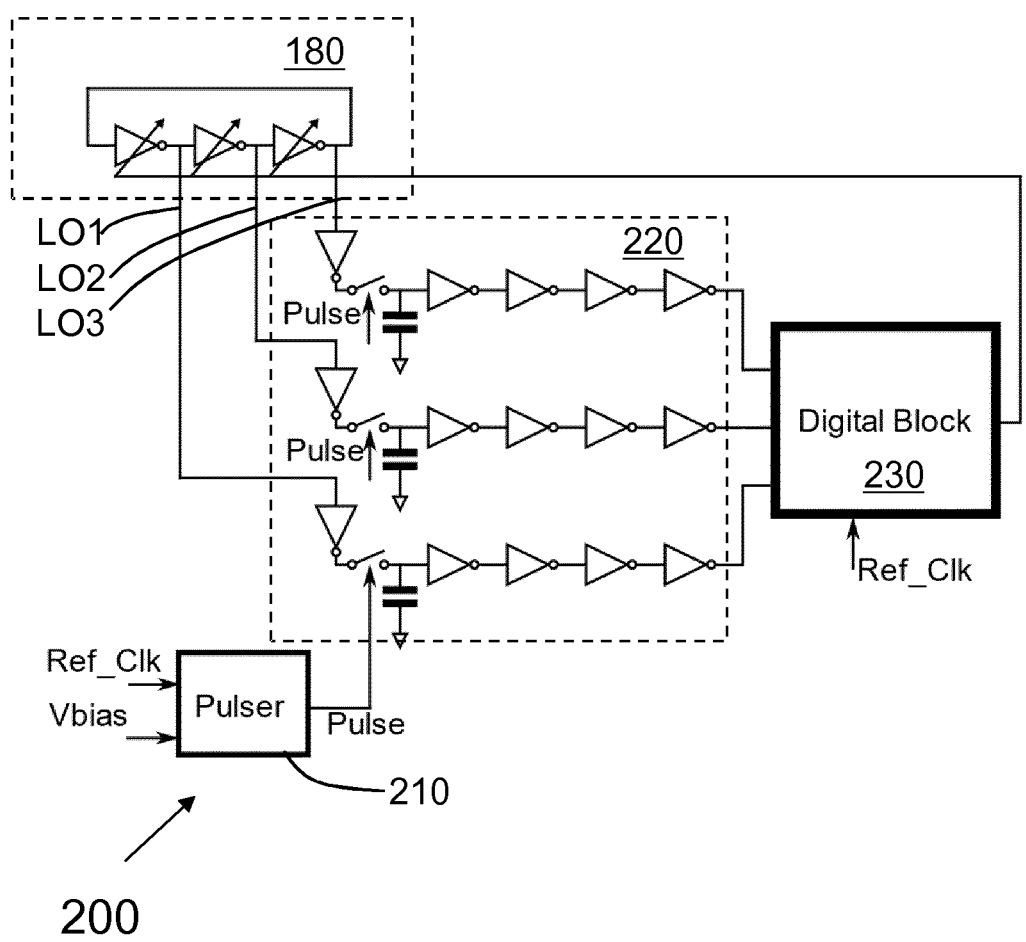
FIG. 2 is a schematic block view of a frequency detector according to one embodiment herein.

FIG. 2 shows a frequency detector 200 according to one embodiment herein.

The frequency detector 200 comprises a pulse generator, Pulser 210 for generating sampling pulses, a sample circuitry 220 for sampling output states of the controlled oscillator 180 and a digital processing unit, Digital Block 230 for processing the sampled states.

The sample circuitry 220 is configured to sub-sample the output states of the controlled oscillator at two or more sampling frequencies, and all sampling frequencies are lower than the frequency of the controlled oscillator. The sample circuitry 220 may sample the output states of the controlled oscillator at different outputs indicated with LO1, LO2, LO3.

The sample circuitry 220 may be configured to sub-sample the output states of the controlled oscillator 180 at a first frequency for a first period of time and sub-sample the output states of the controlled oscillator 180 at a second frequency for a second period of time.

According to some embodiments herein, the sample circuitry 220 may comprise two or more sample circuits to sub-sample the output states of the controlled oscillator 180 at two or more sampling frequencies simultaneously.

The sampled states are inputted to the digital processing unit 230. The digital processing unit 230 is configured to calculate a frequency offset of the oscillator based on the sampled states and generate a control signal based on the frequency offset to tune the frequency of the oscillator 180.

Figure 3:
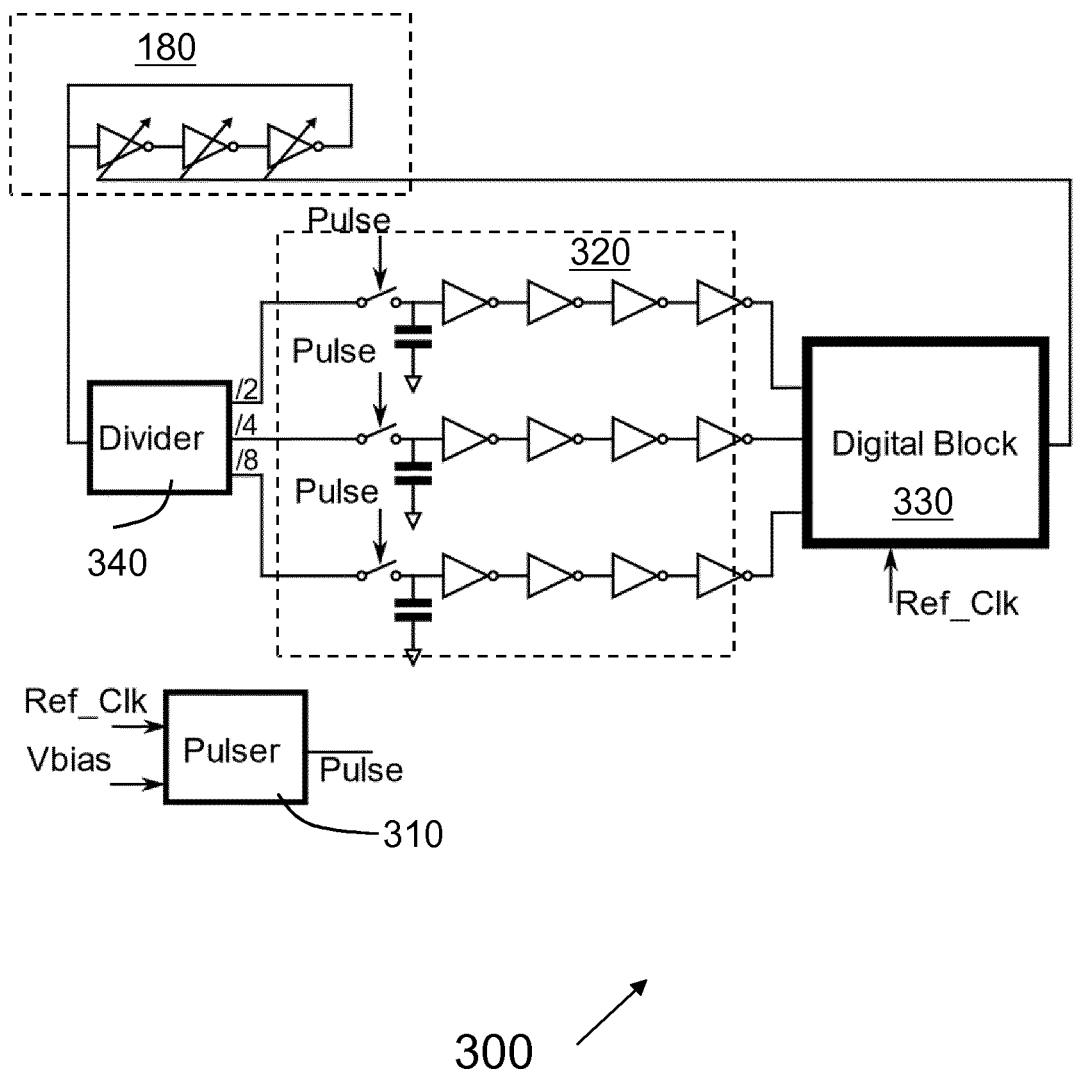
FIG. 3 is a schematic block view of a frequency detector according to one embodiment herein.

FIG. 3 shows a frequency detector 300 according to another embodiment herein.

The frequency detector 300 comprises a pulse generator, Pulser 310 for generating sampling pulses, a sample circuitry 320 and a digital processing unit, Digital Block 330. The frequency detector 300 further comprises a multi-stage frequency divider 340 connected to the output of the controlled oscillator 180. In this embodiment, the sample circuitry 320 samples output states from each stage of the divider 340 and is configured to sub-sample the output states of the divider 340 at a sampling frequency lower than the frequency of the controlled oscillator. The digital processing unit 330 is configured to calculate a frequency offset of the oscillator based on the sampled states and generate a control signal based on the frequency offset to tune the frequency of the oscillator 180.

Figure 4:
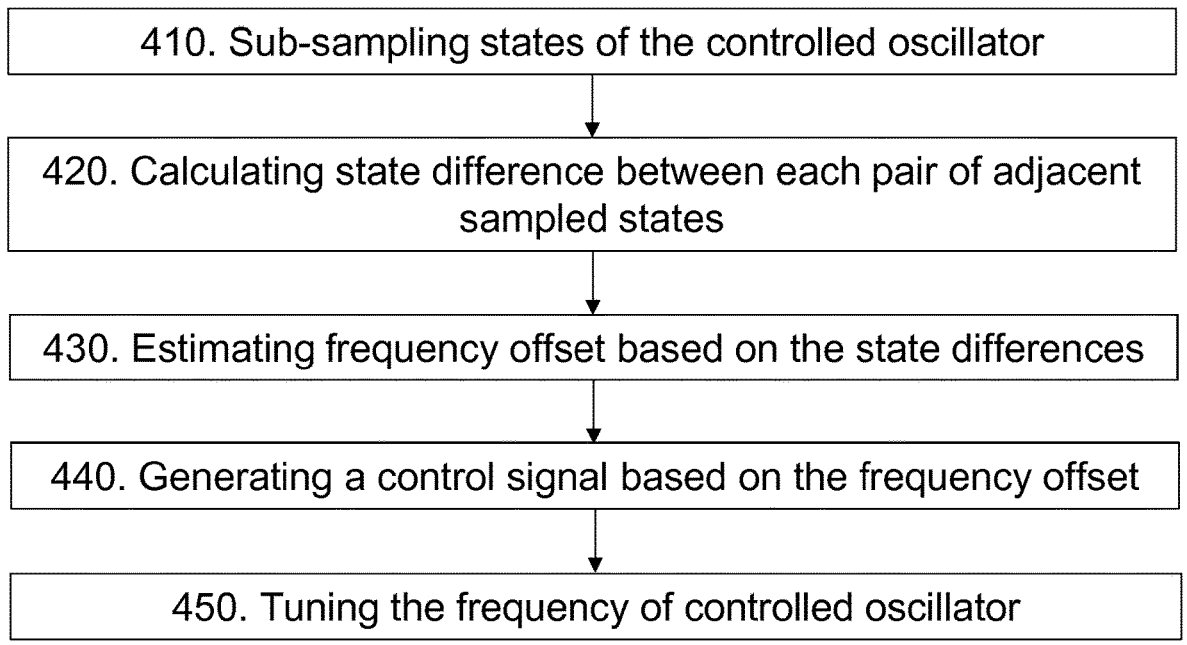
FIG. 4 is a flow chart illustrating a method for measuring and tuning a frequency of a controlled oscillator according to embodiments herein.

A method performed in the frequency detectors 200, 300 for measuring and tuning a frequency of a controlled oscillator will be described with reference to FIG. 4. The method comprises the following actions.

Action 410

The sample circuitry 220, 320 sub-samples states of the controlled oscillator 180 at a sampling frequency lower than the frequency of the controlled oscillator.

To eliminate the need for power hungry frequency dividers operating at full RF frequency, the frequency detection is based on sub-sampling the oscillator state. Unfortunately, the sub-sampling instead creates an alias problem, so that different oscillator frequencies will generate the same sub-sampled signal.

To be able to distinguish the oscillator frequencies with the same sub-sampled signal from each other, subsampling at different sampling frequencies may be performed. So the sample circuitry 220 may be configured to sub-sample the output states of the controlled oscillator at two or more sampling frequencies, and all sampling frequencies are lower than the frequency of the controlled oscillator.

An alternative to using different sampling frequencies, is to solve the alias problem by momentarily operating an RF frequency divider 340 and sampling its state, as shown in FIG. 3. The simplest possible frequency divider may be used, e.g. a cascade of divide-by-two circuits. This results in minimum power overhead, especially since the divider 340 may be used during a fraction of the time only.

The sampling frequencies may be generated in e.g. the pulse generator 210, 310, by relatively low frequency PLLs, operating at a frequency more than an order of magnitude below the RF. These PLLs can thus have very low power compared to an RF PLL.

Action 420

After the oscillator state is sampled and digitized, the sampled states are inputted to the digital processing unit 230, 330. A state difference between each pair of adjacent sampled states is calculated in the digital processing unit 230, 330.

With a ring oscillator, this can be achieved by sampling the digital state, with 1 bit per circuit node or per stage. The state change from previous sample is then calculated, providing a measure of the instantaneous frequency offset from the nearest harmonic of the sampling frequency. Note that the number of this nearest harmonic is unknown, so the absolute frequency is ambiguous, which creates the alias problem. By performing frequency measurements with different sampling frequencies, it is possible to uniquely distinguish between different oscillator frequencies over a wider frequency range than using a single sampling frequency of the same magnitude.

To show the principle and steps or actions of the frequency detection according to embodiments herein, simulations have been performed on a wake-up receiver operating in the 2.45 GHz ISM band, using a 3-stage ring oscillator 180, as shown in FIGS. 2 and 3.

Figure 5:
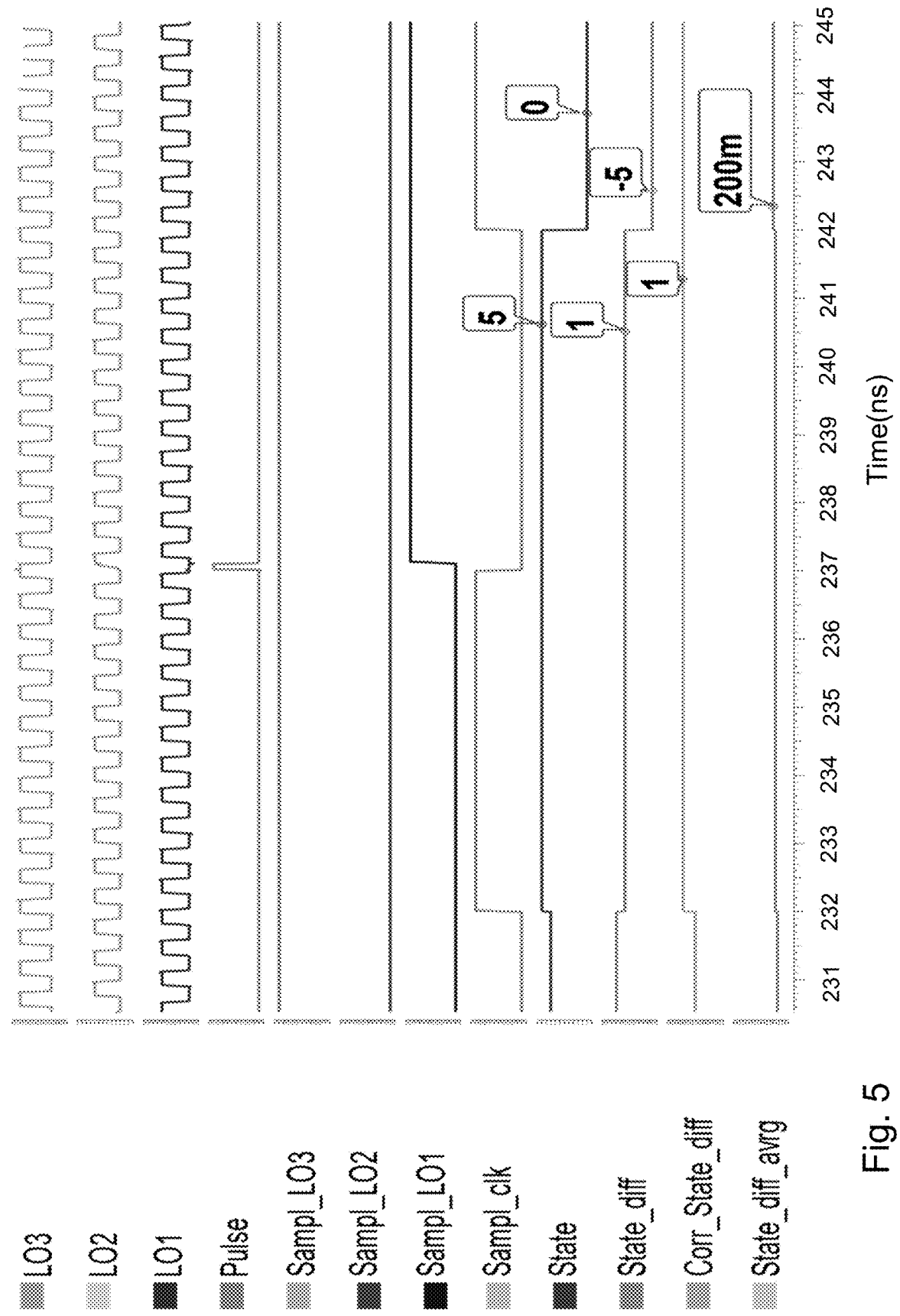
FIG. 5 shows simulation results for the frequency detector according to embodiment herein shown in FIG. 2.

The oscillator 180 will then cycle through six different digital states 101, 001, 011, 010, 110, 100 at the outputs LO1, LO2, LO3. The oscillator 180 will complete one cycle through the six states in 1/2.45 GHz=408 ps, and each state will last 408 ps/6=68 ps. The simulation results are shown in FIG. 5. The total number of states is 6 in this case.

The first three state curves are outputs states LO1, LO2, LO3 from each stage of the ring oscillator 180. The sampled digital states at different outputs of the oscillator 180, indicated in FIG. 3 with "Sampl_LO1", "Sampl_LO2" and "Sampl_LO3", are then used to evaluate the offset frequency from the nearest sampling frequency harmonic. This is achieved by calculating the difference of the states. The calculation may be performed by converting each sampled state to a state number based on its position in the states sequence and subtracting the previous state number from the current state number.

For example, the first step may be to convert the six states into a state number range from zero to 5, indicated in FIG. 5 with "State", according to its position in the states sequence. For example, the different digital states: "101, 001, 011, 010, 110, 100" that the oscillator output cycles through are given the numbers 0 to 5 respectively in FIG. 5. The state "100" is given the number 5 and the state 101 is given the number 0. The previous sample state number is then subtracted from the current. The subtraction result is indicated in FIG. 5 with "State_diff". If there has been no state change, the state difference will be zero, and this result indicates that the oscillator frequency is equal to the harmonic of the sampling frequency. If the difference is equal to 1, the oscillator phase has advanced by one state, indicating that the oscillator frequency is ⅙ of the sampling frequency above the harmonic of the sampling frequency. If the difference is instead −1, the oscillator frequency is ⅙ of the sampling frequency below the harmonic of the sampling frequency, etc.

If the state difference is equal to 3 or −3, it is not possible to tell if the oscillator frequency is ½ sampling frequency above or below the nearest harmonic, because it is half way between two harmonics, so it is below one but above the other. However, this is just momentarily, an average of the state differences for a period of time will be on one of the sides. That is the state difference average may represent a frequency offset from a certain harmonic of the sampling frequency. The average will also provide increased frequency estimation accuracy.

Therefore, according to some embodiments herein, the method may further comprise averaging the state differences for a period of time.

Similar to the ambiguity states as described above, there may be some erroneous state differences which provide the oscillator frequency offset from a different harmonic of the sampling frequency than the other state differences. These ambiguous or erroneous state differences need to be corrected or skipped before calculating the average.

According to some embodiments herein, the method may further comprise correcting some of the state differences so that all the state differences represent frequency offsets from the same harmonic of the sampling frequency.

There are two error correction possibilities. First, the two terms "Average" and "Initial Average" are introduced and the difference between them is explained. "Initial Average" is an average of the state differences for a few first samples during an initial sample period and "Average" is an average of the state differences for all samples during a total sample period.

The purpose of the embodiments herein is to calculate an average of the sampled-states difference, and based on this average, deduct the frequency of the oscillator and correct it. To be able to correct an erroneous sample, the idea is to average the state differences for a few first samples period to get an "Initial Average" and then based on this "Initial Average", to decide to keep a sample or to reject it. At the same time, averaging the overall samples for the total sample period to get an overall "Average", that is different from the "Initial Average".

One way to correct or skip a state difference is to compare every new state difference with the "Initial Average". If it is different from the "Initial Average"+/−1, it is skipped or not counted. That is, the skipped state differences are those that are not comprised in the range of [Initial Average−1, Initial Average+1], If else it is kept and counted in "Average". For example, if the Initial Average is 0, the kept values are the state differences that are in the range [−1,1].

An erroneous state difference may be corrected if the next state difference is correct. For example, for an Initial Average of 1, if the previous state number is 0, the present erroneous state number is 2, and the next correct state number is 2, then the state differences are first 2 then 0, which average out to 1, when both the state differences 2 and 0 are kept. The resulting average is the same as if there are two correct state differences both equal to 1, where the correct states numbers would be 0,1,2.

Note that not counting some samples into "Average" may also introduce an error which results in less precision in the frequency detection.

Another way to correct or skip a state difference is to set the state difference to zero or correct it by adding or subtracting a certain state number. For example, one may just set the ambiguous state differences of +/−3 to zero, to let the other samples decide the sign when calculating Initial Average. Once the sign is known, the sign of the state difference with magnitude 3 can be set.

Another issue is wrap-around, e.g. moving from state number 5 to state number 0, gives a resulting state difference of −5, whereas it should be 1, since the state number 5 is advanced by one state to state number 0. Further, moving from state number 0 to state number 5 gives a resulting state difference of 5, whereas it should be −1. To solve this, state difference results less than −6/2=−3, i.e. minus of the total number of states 6 divided by 2, should be added by 6, and state difference results above 6/2=3, i.e. the total number of states 6 divided by 2, should be subtracted by 6. That is some state differences need to be compensated for wrap-around.

Therefore, according to some embodiments herein, the method may further comprise wrapping around some state differences by subtracting a number representing the total number of states from a state difference if this state difference is higher than the total number of states divided by 2 or adding a number representing the total number of states to a state difference if this state difference is lower than minus of the total number of states divided by 2.

The second way for error correction may be keeping the state differences that would be automatically corrected by the following state difference. That is keeping the state differences that are comprised in the range of [Initial Average−N, Initial Average+N], where N may be higher than 1, but N has a maximum which is limited by wrap around: Nmax=Max_state_difference−|Initial_Average|, where 'Initial Average' is the absolute value of Initial Average, and Max_state_difference is the maximum value of the state differences and is equal to the total number of states divided by 2. For example, in case of sampling a 3-stage ring oscillator outputs, the total number of states is 6 and Max_state_difference is 3, in case of sampling a divider by M, the total number of states is M and Max_state_difference=M/2. When N exceeds this maximum, either the first or the second state difference would be wrapped around, which results in adding a −6 or +6 to the Average and thus adding an error to it.

The state differences that are skipped are the ones that are not comprised in the range of [Initial Average−Max_state_difference+|initial Average|, Initial Average+Max_state_difference−|initial Average|], e.g. for an Initial Average of 0 the range is [−3, 3]. The state differences that are in this range and not in the range of [Initial Average+1, Initial Average−1], i.e. [−1,1], are errors that are kept because the next state difference will correct them, except in the case where the second state difference is an error as well.

For example, for an Initial Average value of 2, the range of state differences that are kept is [1,3]. The example below show cases where error is made in average if an error state difference outside of the range of [Initial Average−Max_state_difference+|initial Average|, Initial Average+Max_state_difference−|initial Average|] is kept. If the previous state number is 0, the present erroneous state number is 4, and the next correct state number is 4, then the state differences are first −2, since the state difference +4 would be wrapped around to −2, then 0, resulting in an Average −1, compared to the value 2 that Average would have in the case of correct states, i.e. 0,2,4.

To go further and include more of the previously skipped state differences i.e. those not in the range: [Initial Average−Max_state_difference+|initial_Average|, Initial Average+Max_state_difference−|initial_Average|], one may add −6 if the state difference is positive and +6 if it is negative, or +/−M if there are M states, and keep the value if it is then within the range. This compensates for wrap-around, and thereby avoids skipping state differences that are relative to a different harmonic than the state difference average.

This corrected state difference is indicated in FIG. 5 with "Corr_State_diff".

To obtain a higher frequency detection resolution, the resulting corrected state differences are then averaged to get a state difference average indicated in FIG. 5 with "State_diff_avrg". Assume averaging for 1 ps without uncorrected errors, then the phase error will be maximum ⅓ period, i.e. 120 degrees, in 1 µs, corresponding to 0.33 MHz. On average the absolute frequency error will be about ½ of that, i.e. 160 kHz. The longer the averaging time, the lower the frequency error, but then the slower the operation. Having an oscillator with more phases, or with analog to digital converters providing higher resolution will also bring down the frequency error. A frequency error due to quantization of 160 kHz is acceptable for wake-up receiver applications.

Action 430

The digital processing unit 230, 330 estimates a frequency offset based on the state differences.

These state differences representing frequency offset samples are then filtered or averaged and used to estimate the oscillator offset frequency.

The digital processing unit 230, 330 may estimate the frequency offset using a look-up-table containing a list of state difference average with corresponding frequency offsets.

The frequency offset may also be calculated by multiplying a sum of the state differences with a constant. The constant may be determined based on sampling frequency, and a period of time for averaging the state differences.

Action 440

The digital processing unit 230, 330 generates a control signal based on the frequency offset.

The control signal is then used to lock the loop or calibrate the oscillator.

Action 450

The digital processing unit 230, 330 tunes the frequency of the controlled oscillator based on the control signal.

The problem with frequency ambiguity is troublesome in all sampling systems. As discussed above, the method according to embodiments herein addresses it by using multiple sampling frequencies. This can be used since the output signal of the oscillator has a slowly varying frequency. Thus the oscillator is measured first with one sampling frequency, and then with another, assuming that the frequency of the oscillator were substantially the same during two sampling periods. Assume that the oscillator frequency is 2.450 GHz, and that it is first sampled at 98 MHz, resulting in a zero-offset frequency from the 25th harmonic. It is then sampled at 70 M Hz, also resulting in a zero offset frequency, but now from the 35th harmonic. The adjacent frequencies also resulting in zero offset frequency at both these sampling frequencies are 490 MHz away from 2.450 GHz. Unless the oscillator has a tuning range higher than 490 MHz, then there is no problem with aliasing with these sampling frequency choices. Note that in the case of a tuning range of less than 960 MHz with a tuning range centered at 2.45 GH the alias problem also would not be seen.

In case the power consumption of a minimalist RF frequency divider can be tolerated, the switching between the two different sampling frequencies can be avoided. The sampling frequency aliasing may then be addressed using a single sampling frequency, by dividing the oscillator output with e.g. 8, as shown in FIG. 3. In this way, the frequency range between two sampling aliases is multiplied by 8 when using the sampled divider output states. Thus, using only one single sampling frequency at 100 MHz will result in an alias-free oscillator frequency detection range of 800 MHz.

Figure 6:
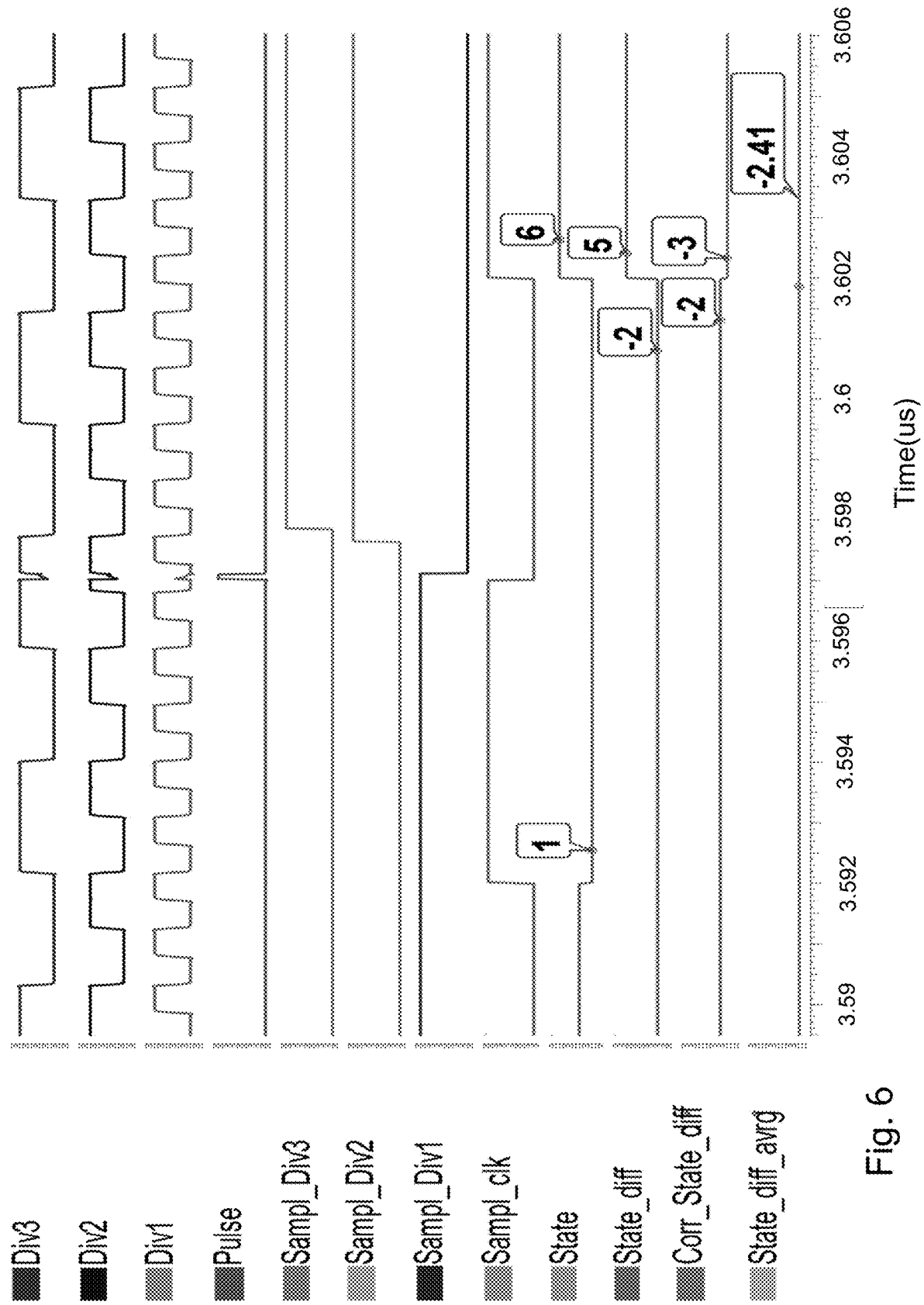
FIG. 6 shows simulation results for the frequency detector according to embodiment herein shown in FIG. 3.

FIG. 6 shows simulation results for the frequency detector 300. The first three state curves Div1, Div2, Div3 are output states of divide by 2, 4 and 8 respectively. The 3 sampled outputs of the divider, i.e. divide by 2, 4 and 8, are indicated in FIG. 5 with "Sampl_Div1", "Sampl_Div2" and "Sampl_Div3" respectively. The 3 sampled outputs of the divider will cycle through 8 states with number from 0 to 7, indicated in FIG. 6 with "State". Similarly, as for the output of the oscillator, the state difference is calculated by subtracting the current state from the previous one. The subtraction result is indicated in FIG. 6 with "State_diff". The "State_diff" is then corrected by accounting for the wraparound. This corrected state difference is indicated in FIG. 6 with "Corr_State_diff" which will be then filtered or averaged to obtain a high frequency detection resolution. The quantization error in this case will be a maximum of 4 periods. Then if averaging this state difference for 4 µs the maximum frequency error is 1 MHz.

For example, if one wants to lock the RF oscillator frequency at 2.45 GHz using a sampling frequency of 100 MHz, the offset frequency should be equal to 6.25 MHz, since the oscillator frequency 2.45 GHz divided by 8 is 306.25 MHz. The adjacent alias frequencies are thus 1.65 GHz and 3.25 GHz, since the divided by 8 frequencies are then 206.25 MHz and 406.25 MHz. These adjacent alias frequencies are far enough from 2.45 GHz to be outside the frequency tuning range of the oscillator, which should cover a band in presence of process, voltage and temperature (PVT) variations. Process variations may then be corrected using a memory that re-uses the same oscillator control signal or word for the next time when the same frequency is to be generated, or interpolation may be used between previously generated frequencies stored in a table. This may be used to reduce the time required to change the local oscillator frequency.

Figure 7:
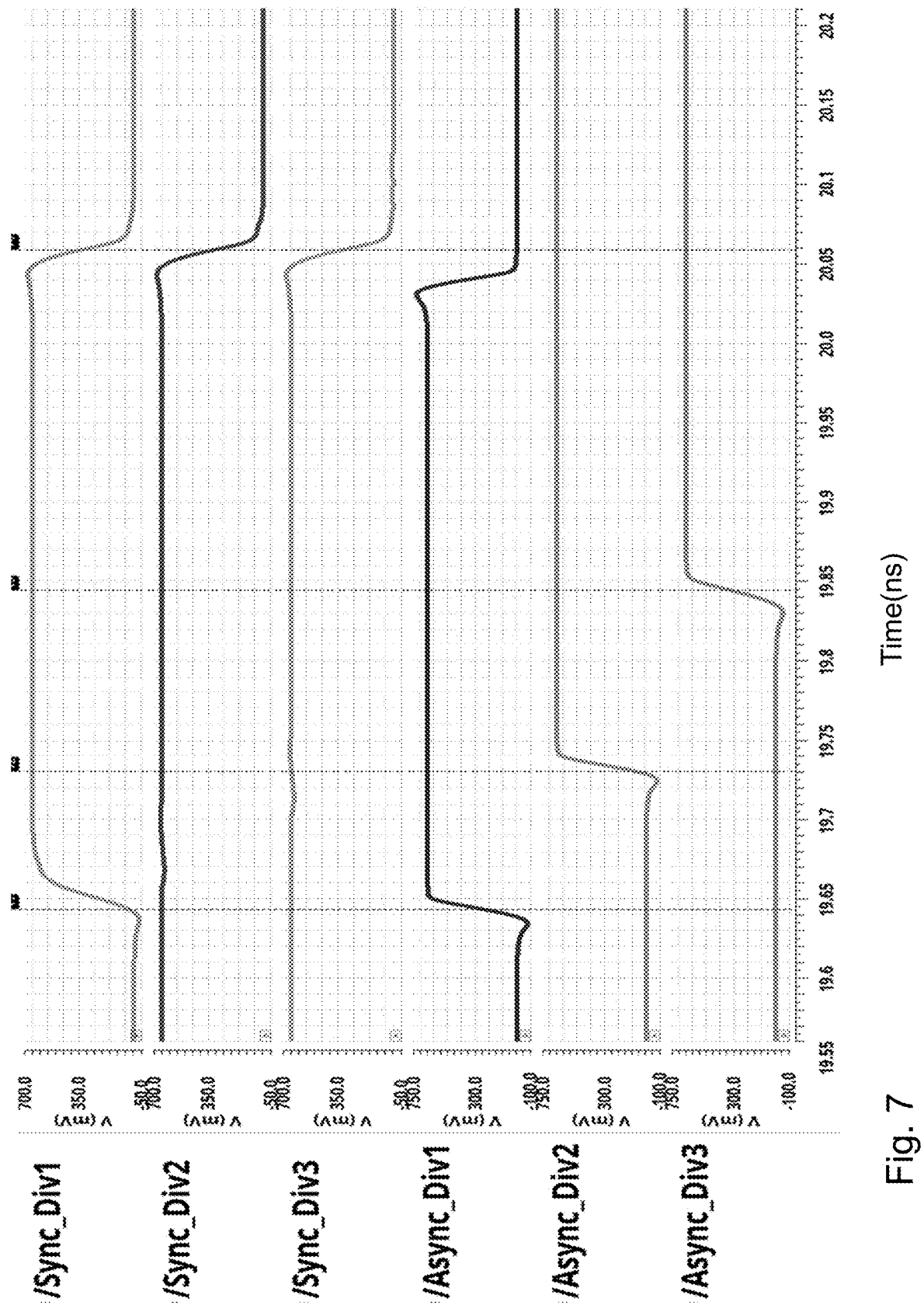
FIG. 7 shows simulation results for a synchronous divider and an asynchronous divider.

To achieve lowest power consumption an asynchronous divider may be used. Unfortunately, such a divider has a delay between the transitions of the signals representing its state. At some sampling instants directly sampling these signals then results in a false state observation that may corrupt the frequency detection. One solution is to use a synchronous divider or counter. As shown in FIG. 7, the transitions of the outputs of the synchronous divider all occur at the same moment in time, which solves the problem but at the expense of a higher power consumption:

The synchronous divider power consumption for a 2.45 GHz clock is: 8.5 µW

The asynchronous divider power consumption for a 2.45 GHz clock is: 4.4 µW

Figure 8:
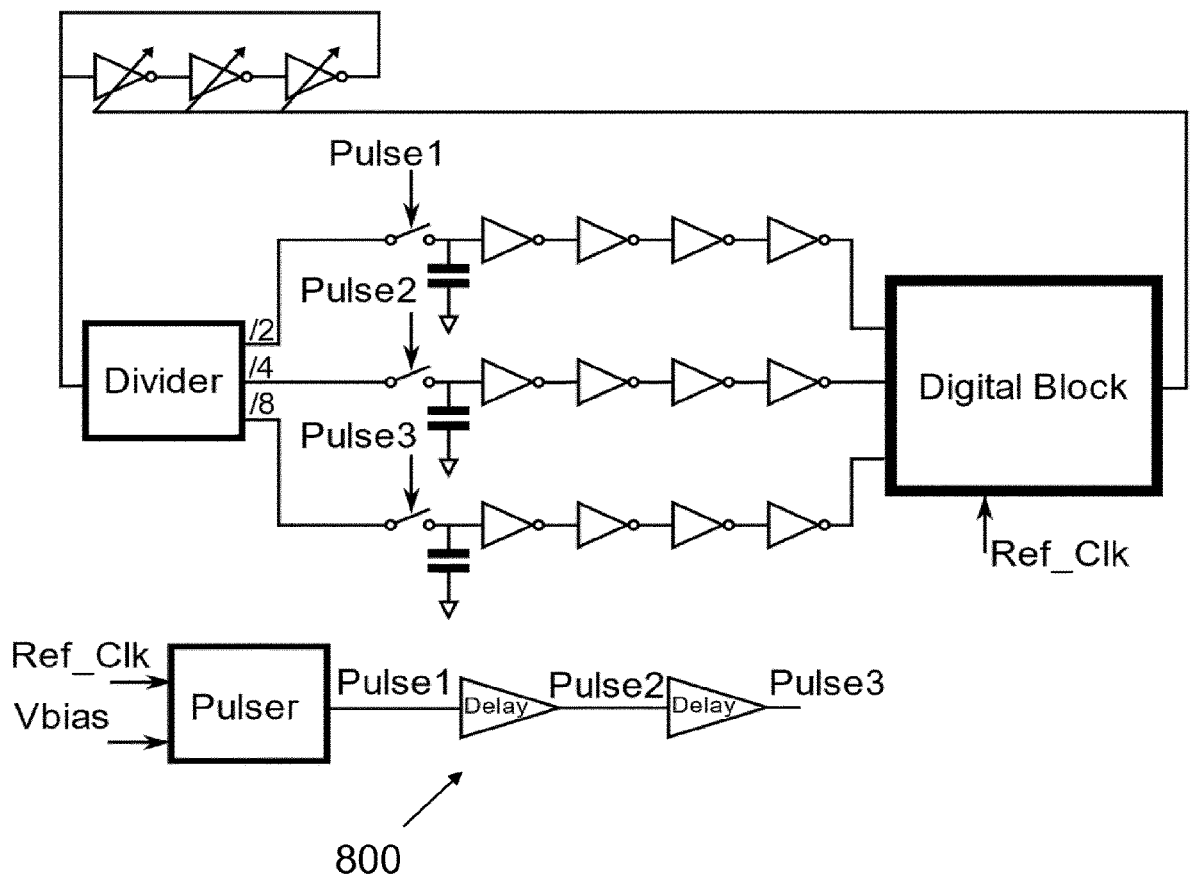
FIG. 8 is a block diagram illustrating a frequency detector according to one embodiment herein.

Another solution may be to use delay cells to synchronize the asynchronous divider outputs. If these delay cells are used for the divider output their power consumption may be high, and the power reduction advantage over the synchronous divider may be limited. To further reduce power consumption the delay cells may instead be used to delay the sampling signal as shown in FIG. 8. This sampling signal frequency is at 100 MHz, much lower than the 3 outputs of the divider that are at 1.2 GHz, 600 MHz and 300 MHz, resulting in much less power consumption. The delay cells are tuned to match the timing delay between the different asynchronous divider outputs.

To further decrease power consumption, the frequency divider may be turned off after the frequency locked loop has settled. Then the oscillator output is sampled instead for increased frequency accuracy and reduced power consumption. The frequency locked loop then is able to track and counteract the oscillator frequency variations due to supply voltage and temperature changes.

The generation of the sampling clocks with low frequency PLLs is feasible since frequency dividers in that frequency range may be realized with extremely low power consumption in modern silicon technologies. For example, a ten stage divider chain with 28 nW power consumption operating at 32 MHz is reported in 28 nm FDSOI technology.

Figure 9:
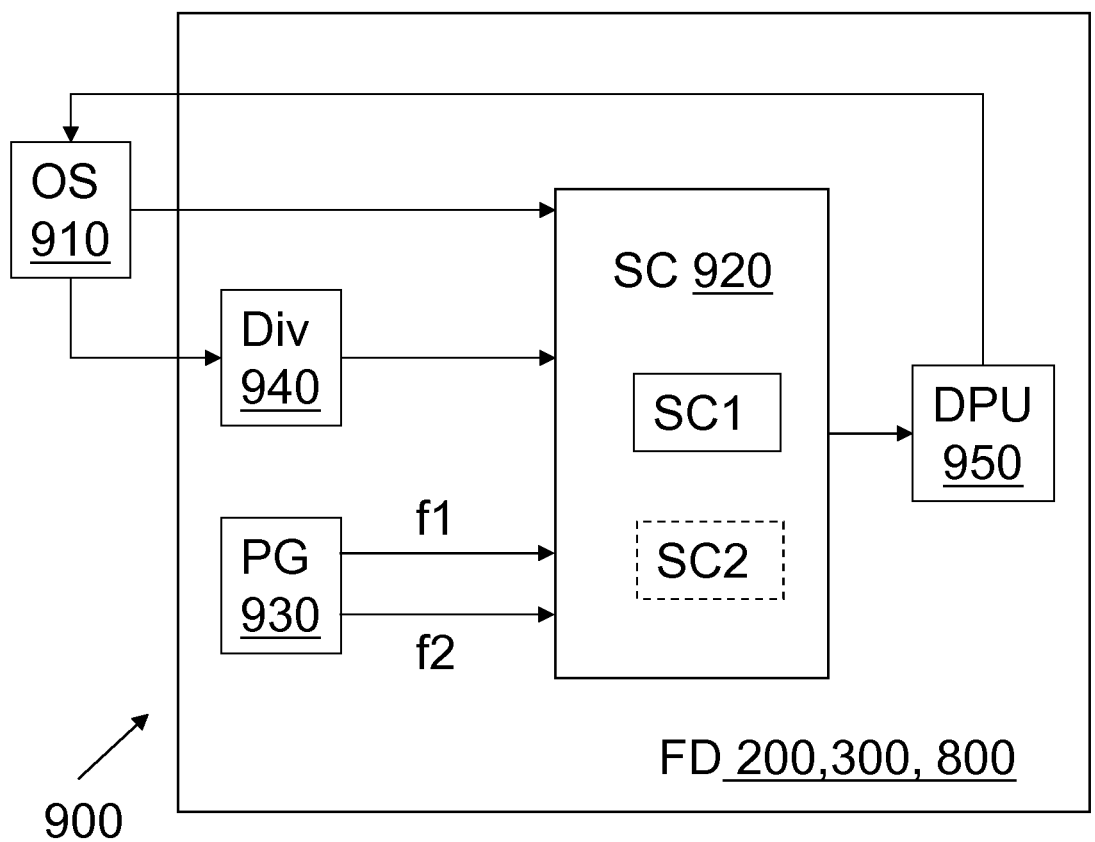
FIG. 9 is a block diagram illustrating a frequency generation circuitry according to embodiments herein.

FIG. 9 shows a frequency generation circuitry 900 according to embodiments herein. The frequency generation circuitry 900 comprises a controlled oscillator 910 and a frequency detector FD 200, 300, 800 according to embodiments herein as shown in FIGS. 2, 3, and 8. The controlled oscillator 910 may be a multi-stage ring oscillator, and the sample circuitry is configured to sub-sample the states of the ring oscillator at the output of each stage.

As described above, the sampling circuitry SC 920 in the frequency detector 200, 300, 800 may comprise two or more sampling circuits SC1, SC2 and sub-sample states of the controlled oscillator 910 at outputs of the controlled oscillator at two or more sampling frequencies f1, f2 simultaneously. The sample pulses with different frequencies may be generated by a pulse generate circuit PG 930.

The frequency detector 200, 300, 800 may sub-sample states of the controlled oscillator at outputs of the controlled oscillator 910 at two sampling frequencies f1, f2 one at a time.

The frequency detector 200, 300, 800 may sub-sample states of the controlled oscillator at outputs of a multi-stage frequency divider Div 940 connected to the controlled oscillator 910.

The frequency detection and calibration of the oscillator 910 may be performed non-continuously or periodically. Based on the estimated frequency offset, sub-sampling may be performed alternatingly between sub-sampling the outputs of the multi-stage frequency divider 940 connected to the controlled oscillator 910 and sub-sampling the outputs of the controlled oscillator 910.

A digital processing unit DPU 950 processes the sampled states, calculates a frequency offset of the oscillator 910 based on the sampled states and generates a control signal based on the frequency offset to tune the frequency of the oscillator 910.

Figure 10:
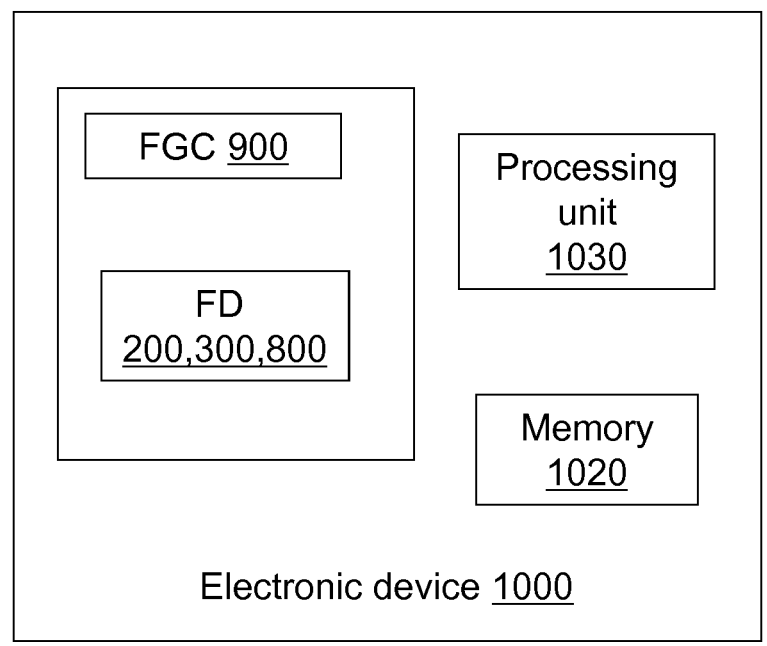
FIG. 10 is a block diagram illustrating an electronic device in which a frequency generation circuitry according to embodiments herein may be implemented.

The frequency detector 200, 300, 800 and the frequency generation circuitry 900 may be employed in various integrated circuits, electronic circuits, devices or apparatus. FIG. 10 shows a block diagram for an electronic device 1000. The electronic device 1000 comprises a frequency generation circuitry FGC 900, which comprises a frequency detector FD 200, 300, 800 according to embodiments herein. The electronic device 1000 may be a receiver, a transmitter or a transceiver. The electronic device 1000 may comprise other units, where a memory 1020, a processing unit 1030 are shown.

To summarize, the embodiments herein provide a technique for digital frequency measurement, calibration and locking of local oscillator frequency in an ultra-low power wakeup receiver, where a conventional PLL would be too power consuming. Lower frequency PLLs are used to provide accurate sampling pulses. The frequency measurement is then based on sub-sampling the state of the oscillator. Multiple sampling frequencies may be used to solve the aliasing problem without employing high sampling frequencies. As an alternative a simple RF frequency divider e.g. dividing by 8, may be used momentarily. This will also eliminate aliases inside the oscillator tuning range. The oscillator frequency is estimated by filtering or averaging the frequency samples, which are calculated as phase state differences of the oscillator and/or divider. The technique may be used in an all-digital frequency locked loop (ADFLL), or for oscillator frequency calibration. The digital implementation provides high flexibility in algorithms and operation modes.

Those skilled in the art will understand that the frequency detector 200, 300, 800 and the frequency generation circuitry 900 according to embodiments herein may be implemented by any semiconductor technology, e.g. Bi-polar, NMOS, PMOS, CMOS or Micro-Electro-Mechanical Systems (MEMS) technology etc.

The word "comprise" or "comprising", when used herein, shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A frequency detector for measuring and tuning a frequency of a controlled oscillator comprising:
    a pulse generator for generating sampling pulses;
    a sample circuitry for sampling output states of the controlled oscillator; and
    a digital processing unit; wherein
    the sample circuitry is configured to sub-sample the output states of the controlled oscillator at two or more sampling frequencies, and wherein the two or more sampling frequencies are lower than the frequency of the controlled oscillator; and
    the digital processing unit is configured to calculate a frequency offset of the controlled oscillator based on the sampled output states and generate a control signal based on the frequency offset to tune the frequency of the controlled oscillator.

2. The frequency detector according to claim 1, wherein the sample circuitry is configured to sub-sample the output states of the controlled oscillator at a first frequency for a first period of time and sub-sample the output states of the controlled oscillator at a second frequency for a second period of time.

3. The frequency detector according to claim 1, wherein the sample circuitry comprises two or more sample circuits configured to sub-sample the output states of the controlled oscillator at different sampling frequencies simultaneously.

4. A frequency detector for measuring and tuning a frequency of a controlled oscillator comprising:
    a pulse generator for generating sampling pulses;
    a multi-stage frequency divider connected to the output of the controlled oscillator;
    a sample circuitry for sampling output states from each stage of the divider; and
    a digital processing unit; wherein the sample circuitry is configured to sub-sample the output states of the divider at a sampling frequency lower than the frequency of the controlled oscillator; and
    the digital processing unit is configured to calculate a frequency offset of the controlled oscillator based on the sampled output states and generate a control signal based on the frequency offset to tune the frequency of the controlled oscillator.

5. The frequency detector according to claim 4, wherein the sample circuitry is further configured to sub-sample output states of the controlled oscillator.

6. The frequency detector according to claim 4, wherein the controlled oscillator is a multi-stage ring oscillator, and the sample circuitry is configured to sub-sample the output states of the ring oscillator at an output of each stage.

7. A method for measuring and tuning a frequency of a controlled oscillator comprising:
    sub-sampling states of the controlled oscillator at a sampling frequency lower than the frequency of the controlled oscillator;
    calculating a state difference between pairs of adjacent sampled states;
    estimating a frequency offset based on the state differences;
    generating a control signal based on the frequency offset; and
    tuning the frequency of the controlled oscillator based on the control signal.

8. The method according to claim 7, wherein sub-sampling states of the controlled oscillator comprises sub-sampling outputs of the controlled oscillator at two sampling frequencies simultaneously.

9. The method according to claim 7, wherein sub-sampling states of the controlled oscillator comprises sub-sampling outputs of the controlled oscillator at two sampling frequencies one at a time.

10. The method according to claim 7, wherein sub-sampling states of the controlled oscillator comprises sub-sampling outputs of a multi-stage frequency divider connected to the controlled oscillator.

11. The method according to claim 7, wherein calculating a state difference between each pair of adjacent states comprises:
converting each sampled state to a state number based on its position in the states sequence; and
subtracting the previous state number from the current state number.

12. The method according to claim 7, further comprising wrapping around one or more state differences by subtracting a number representing the total number of states from a state difference if the state difference is higher than the total number of states divided by 2, or adding a number representing the total number of states to a state difference if the state difference is lower than minus of the total number of states divided by 2.

13. The method according to claim 7, further comprising correcting or skipping at least one of the state differences.

14. The method according to claim 7, further comprising averaging the state differences for a few first samples period to get an Initial Average of the state differences.

15. The method according to claim 14, further comprising skipping at least one of the state differences based on comparing a state difference with the Initial Average.

16. The method according to claim 15, wherein the state differences that are skipped are those that have a state difference smaller than the Initial Average minus 1 and larger than the Initial Average plus 1.

17. The method according to claim 15, wherein the state differences that are skipped are those that not comprised in the range of [Initial Average−Max_state_difference+|initial Average|, Initial Average+Max_state_difference−|initial Average|], wherein Max_state_difference is the maximum value of the state differences and |initial Average| is the absolute value of the Initial Average.

18. The method according to claim 7, further comprising averaging the state differences for a period of time to obtain a state difference average.

19. The method according to claim 7, wherein estimating a frequency offset based on the state differences is performed using a look-up-table containing a list of state difference averages with corresponding frequency offsets.

20. The method according to claim 7, wherein estimating a frequency offset based on the state differences is performed by multiplying a sum of the state differences with a constant, wherein the constant is determined based on the sampling frequency and a period of time for averaging the state differences.

21. The method according to claim 7, wherein the method is performed periodically.

22. The method according to claim 7, wherein based on the estimated frequency offset, sub-sampling is performed alternatingly between sub-sampling the outputs of a multi-stage frequency divider connected to the controlled oscillator and sub-sampling the outputs of the controlled oscillator.

* * * * *